United States Patent [19]
Lada, Jr.

[11] Patent Number: 5,794,057
[45] Date of Patent: Aug. 11, 1998

[54] CIRCUIT FOR REDUCING AUDIO AMPLIFIER NOISE DURING POWERING ON AND OFF

[75] Inventor: Henry F. Lada, Jr., Cypress, Tex.

[73] Assignee: Compaq Computer Corporation, Houston, Tex.

[21] Appl. No.: 818,346

[22] Filed: Mar. 15, 1997

Related U.S. Application Data

[63] Continuation of Ser. No. 398,396, Mar. 3, 1995.

[51] Int. Cl.⁶ .................................................. G06F 1/26
[52] U.S. Cl. .................... 395/750.01; 330/267; 330/10; 330/297; 369/124
[58] Field of Search .................... 395/750.01, 750.02; 330/267, 10, 297; 369/124

[56] References Cited

U.S. PATENT DOCUMENTS

| | | | |
|---|---|---|---|
| 4,441,086 | 4/1984 | Karlow et al. | 330/297 |
| 4,673,889 | 6/1987 | Cini et al. | 330/10 |
| 4,674,031 | 6/1987 | Siska, Jr. | 364/184 |
| 4,710,771 | 12/1987 | Banno et al. | 345/211 |
| 5,144,441 | 9/1992 | Sparks et al. | 348/730 |
| 5,307,025 | 4/1994 | Colvin et al. | 330/267 |
| 5,410,713 | 4/1995 | White | 395/750 |
| 5,428,494 | 6/1995 | Ahuja | 361/62 |
| 5,442,617 | 8/1995 | Kim | 369/124 |
| 5,442,627 | 8/1995 | Kim | 369/124 |

OTHER PUBLICATIONS

LM 1971 μPOT™ Digitally controlled 62 dB Audio Attenuator with Mute.
LM 1973 μPOT™ 3–Channel 76dB Audio Attenuator with Mute.

*Primary Examiner*—Jack B. Harvey
*Assistant Examiner*—Eric S. Thlang
*Attorney, Agent, or Firm*—Pravel, Hewitt, Kimball & Krieger

[57] ABSTRACT

An audio power management system for a computer to eliminate noise signals associated with the power-down and power-up operations of the computer during power management operations. The audio power management system asserts a speaker mute signal before power is removed from the amplifier to reduce transient conditions. During power up, the speaker mute signal is applied to the amplifier for a period after power is applied to the amplifier. This control is done from a single digital output.

11 Claims, 4 Drawing Sheets

CIRCUIT FOR REDUCING AUDIO AMPLIFIER NOISE DURING POWERING ON AND OFF

This application is a continuation of U.S. application Ser. No. 08/398,396, filed Mar. 3, 1995.

BACKGROUND OF THE INVENTION

1. Field of the Invention

This invention relates generally to an audio system for a computer and, more particularly, to an audio power management system for eliminating noise generated when portions of the computer are powered up or powered down during power management operation.

2. Description of the Related Art

The rapid acceptance of computer technology by corporations as well as consumers has led to the widespread use of computers. The daily operations of these computers in aggregate consume a significant amount of electrical energy. Thus, efficient power management of each computer is important for many reasons, including the conservation of energy and the protection of the environment.

Many of today's desktop personal computers offer power-down capability to conserve energy. In such a system, the computer automatically powers down the disk drive and removes power from certain electronics when the computer has been idle for a certain period of time. Upon detecting keyboard activities or other predefined activating events, the computer "wakes-up" automatically by applying power to turn on the electronic subsystems.

In a separate trend, audio capabilities of computers are increasing. Multimedia is becoming very prevalent and some of the audio subsystems are becoming more sophisticated. It is common to provide separate audio amplifiers in the computer to drive either a high quality internal speaker or external speakers and headphones.

However, a problem occurs with the audio subsystems. Whenever the amplifiers are turned on or off, a pop or snap occurs. This has been considered acceptable when the entire computer system is turned on or off. But the merging of power conservation features with the audio subsystem creates a greater problem. During power conservation operation, the audio amplifiers will be powered on and off. This will result in pops and snaps, as at system turn on or off, but now the pops and snaps will not be associated with the larger event of system activation. Indeed, the pops and snaps will generally occur when the computer is not being used. This seemingly random popping and snapping thus is a problem which must be solved. Further, the number of digital pins to control this activity may be limited, rendering the control even more difficult.

SUMMARY OF THE INVENTION

A computer according to the present invention includes an audio power management system that coordinates the muting of the output of the audio amplifier and the application of power to the amplifier. To eliminate undesired noise signals during transient conditions, such as the period when power to the amplifier is applied or removed, mute control circuitry is provided which temporarily, during power-up and power down, mutes all signals from the speaker for a predetermined period of time. When power to the amplifier is applied, a minimum number of transients are experienced at the speaker. During power-down, muting is similarly imposed on the audio amplifier immediately before the removal of the power supply voltage to the amplifier. Further, the muting and power are controlled from a single digital output.

These and other features of the present invention will be understood upon reading of the following description along with the drawings.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 2:
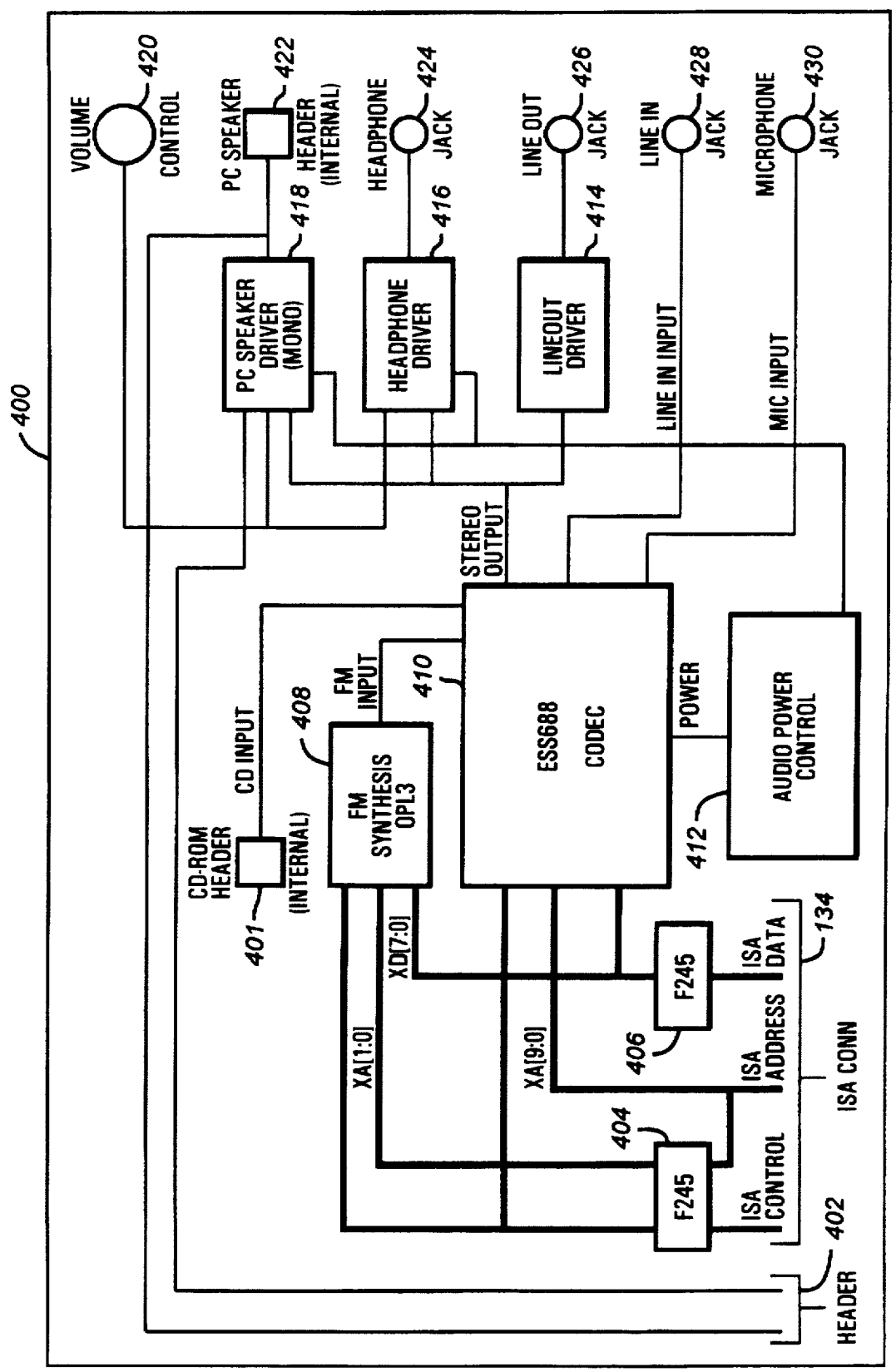
FIG. 2 is a block diagram of an audio system in accordance with the invention.
Figure 3:
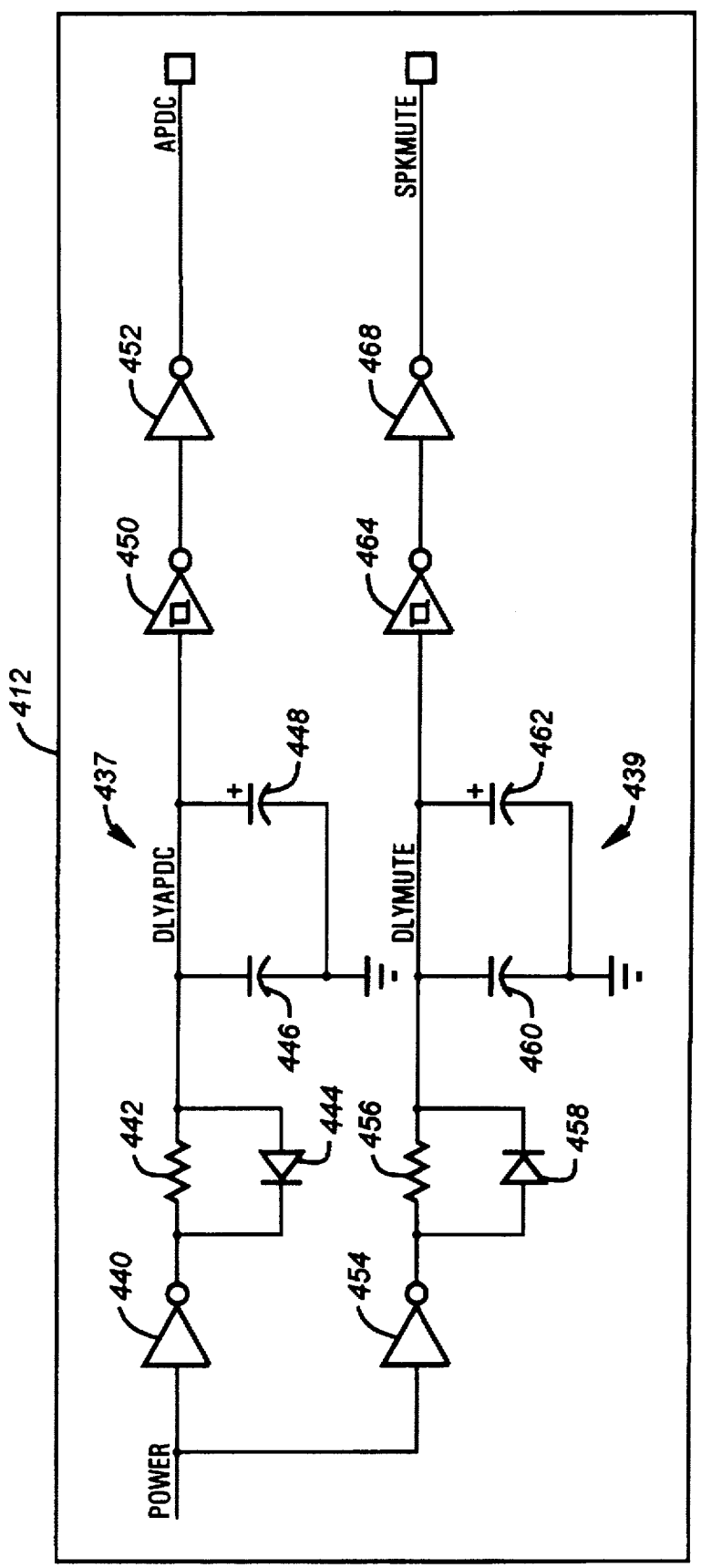
FIG. 3 is a schematic diagram of an audio power management system in accordance with the invention.
Figure 4:
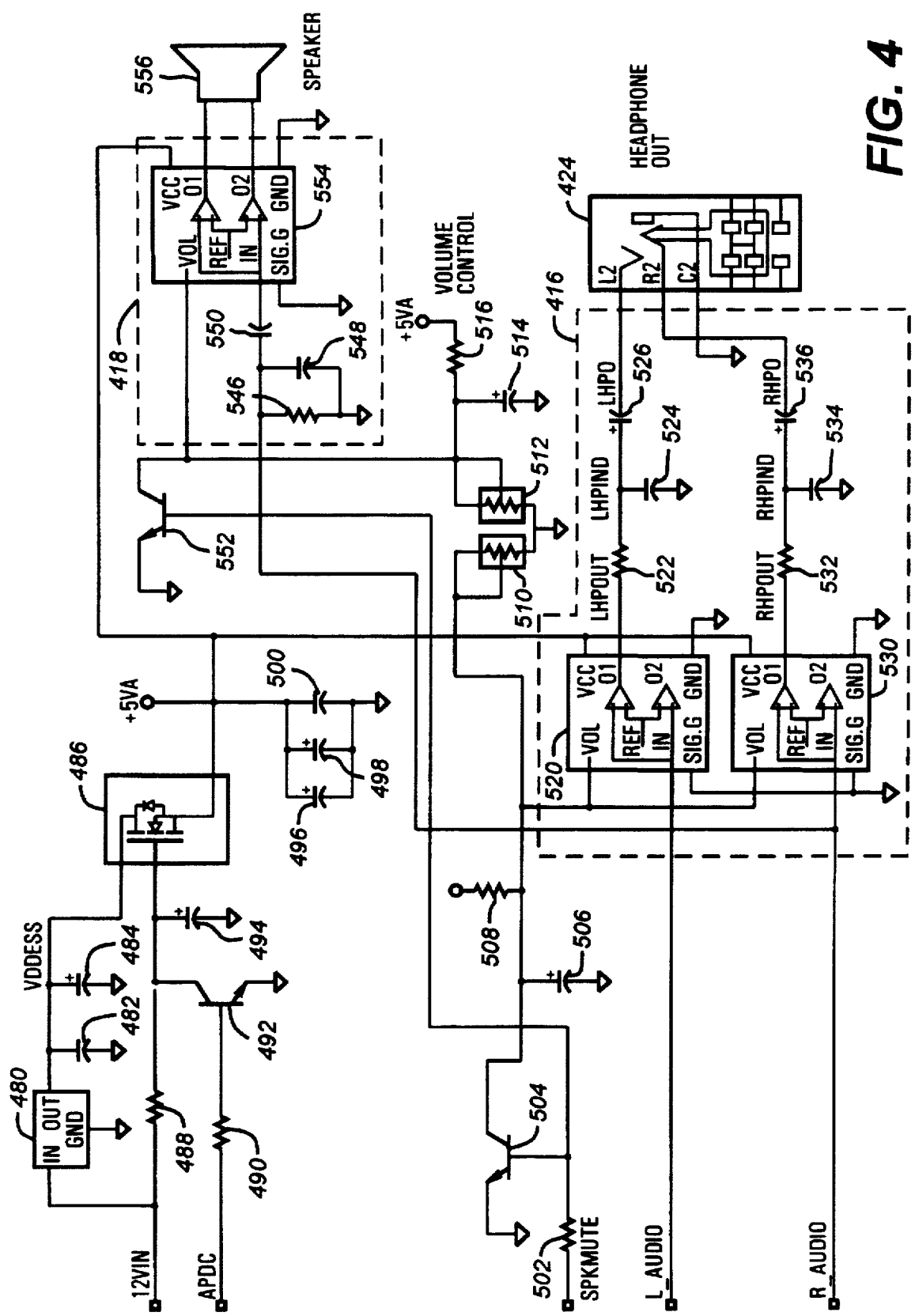
FIG. 4 is a schematic diagram of an audio amplifier using an audio power management in accordance with the invention.

Prior to discussing FIGS. 2–4 which detail an audio power management system according to the present invention, a general background summary of the operation of the personal computer which controls the audio power management system of the present invention merits review.

Figure 1:
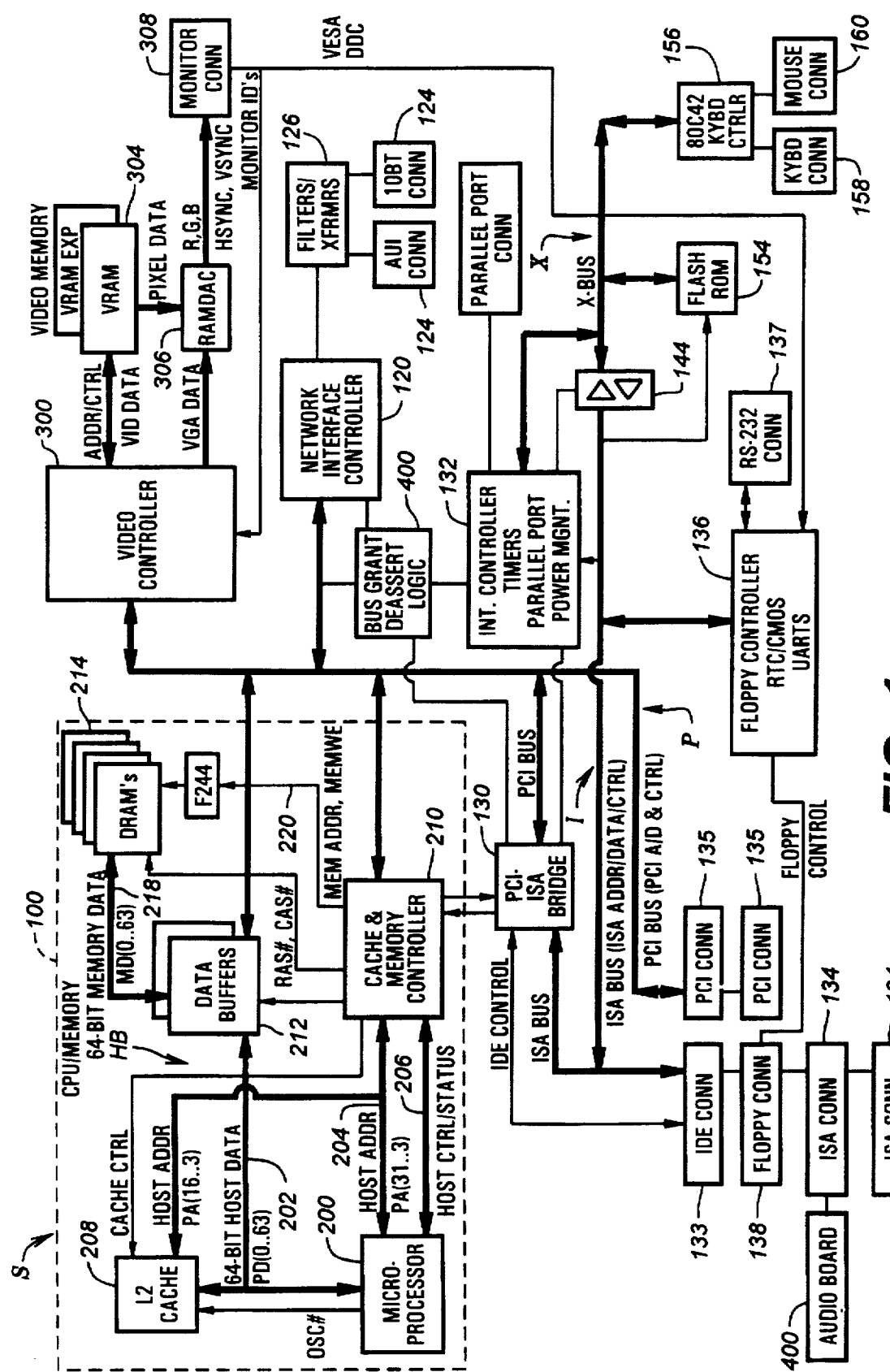
FIG. 1 is a block diagram of a computer system using an audio system according to the invention.

Referring to FIG. 1, a computer system S according to the present invention is shown. In the preferred embodiment, there are two primary buses located in the system S. The first bus is the PCI or Peripheral Component Interconnect bus P which includes an address/data portion and control signal portion. The second primary bus in the system S is the ISA bus I. The ISA bus I includes an address portion, a data portion 110, and a control signal portion 112. The PCI and ISA buses P and I form the backbones of the system S.

A CPU/memory subsystem 100 is connected to the PCI bus P. The processor 200 is preferably the Pentium processor from Intel, preferably operating externally at 60 or 66 MHz, but could be an 80486 from Intel or processors compatible with the 80486 or Pentium or other processors if desired. The processor 200 provides data, address, and control portions 202, 204, 206 to form a host bus HD. A level 2 (L2) or external cache memory system 208 is connected to the host bus HB to provide additional caching capabilities to improve performance of the computer system. The L2 cache 208 may be permanently installed or may be removable if desired. A cache and memory controller and PCI bridge chip 210, such as the 82434X chip from Intel Corporation or the chip described in patent applications Ser. Nos. 08/324,016, entitled "SINGLE BANK, MULTIPLE WAY CACHE MEMORY" and 08/324,246, entitled "MEMORY CONTROLLER WITH WRITE POSTING QUEUES FOR PROCESSOR AND I/O BUS OPERATIONS AND ORDERING LOGIC FOR CONTROLLING THE QUEUES", filed Oct. 14, 1994 and hereby incorporated by reference, is connected to the control portion 206 and to the address portion 204. The bridge chip 210 is connected to the L2 cache 208 as it incorporates the cache controller and therefore controls the operation of the cache memory devices in the L2 cache 208. The bridge chip 210 is also connected to control a series of data buffers 212. The data buffers 212 are preferably similar to the 82433LX from Intel, or those described in patent applications Ser. Nos. 08/324,246 as incorporated above and 08/323,263, entitled "DATA ERROR DETECTION AND CORRECTION SYSTEM", filed Oct. 14, 1994 and hereby incorporated by reference, and are utilized to handle memory data to a main memory array 214. The data buffers 212 are connected to the processor data portion 202 and receive control signals from the bridge chip 210. The data buffers 212 are also connected to the PCI bus P for data transfer over that bus. The data buffers 212 provide a memory data bus 218 to the memory array 214, while a memory address and memory control signal bus 220 is provided from the bridge chip 210.

A video controller 300 is connected to the PCI bus P. Video memory 304 is used to store the graphics data and is connected to the video graphics controller 300 and a digital/analog converter (RAMDAC) 306. The video graphics controller 300 controls the operation of the video memory 304, allowing data to be written and retrieved as required. A video connector 308 is connected to the RAMDAC 306. A monitor (not shown) is connected to the video connector 308.

A network interface controller (NIC) 120 is connected to the PCI bus P. Preferably the controller 120 is a single integrated circuit and includes the capabilities necessary to act as a PCI bus master and slave and the circuitry to act as an Ethernet interface. Alternate Ethernet connectors 124 are provided on the system S and are connected to filter and transformer circuitry 126, which in turn is connected to the controller 120. This forms a network or Ethernet connection for connecting the computer system S to a local area network (LAN).

A PCI-ISA bridge 130 is provided to convert signals between the PCI bus P and the ISA bus I. The PCI-ISA bridge 130 includes the necessary address and data buffers and latches, arbitration and bus master control logic for the PCI bus, ISA arbitration circuitry, an ISA bus controller as conventionally used in ISA systems, an IDE (integrated drive electronics) interface, and a DMA controller. Preferably the PCI-ISA bridge 130 is a single integrated circuit, but other combinations are possible. A series of ISA slots 134 are connected to the ISA bus I to receive ISA adapter cards, including an audio board 400 which contains an audio system according to the present invention. A series of IDE slots 133 are connected to the ISA bus I and the PCI-ISA bridge chip 130 to receive various IDE devices, such as hard disk drives, tape drives and CD-ROM drives. A series of PCI slots 135 are connected to the PCI bus P to receive PCI adapter cards.

A combination I/O chip 136 is connected to the ISA bus I. The combination I/O chip 136 preferably includes a floppy disk controller, real time clock (RTC), CMOS memory, two UARTs, and various address decode logic. A floppy disk connector 138 for receiving a cable to a floppy disk drive is connected to the combination I/O chip 136 and the ISA bus I. Serial port connectors 137 are also connected to the combination I/O chip 136. A data buffer 144 is connected to the ISA bus I to provide an additional X bus X for various additional components of the computer system. A flash ROM 154 receives its control, data and address signals from the X bus X for data transfer. Preferably the flash ROM 154 contains the BIOS information for the computer system and can be reprogrammed to allow for revisions of the BIOS. An 8042 or keyboard controller 156 is connected to the X bus X. The keyboard controller 156 is of conventional design and is connected in turn to a keyboard connector 158 and a mouse or pointing device connector 160.

A miscellaneous system logic chip 132 is connected to the X bus X. The miscellaneous system logic chip 132 contains counters and timers as conventionally present in personal computer systems, an interrupt controller for both the PCI and ISA buses P and I, enhanced parallel port circuitry and power management logic, as well as other miscellaneous circuitry. The audio board 400 is a separate card which is plugged into the ISA connector 134 to provide various audio functions to the computer system S. This is an exemplary computer system S and other variations could readily be developed by one skilled in the art.

Turning now to FIG. 2, the audio subsystem of computer system S is located on the audio board 400. The audio board 400 has a CD-ROM header 401 which carries CD-ROM audio output signal and a speaker header 402 which carries the speaker output and input signals for the computer system S to allow integration with the speaker normally provided in a computer system S without the audio board 400. The audio board 400 communicates with system S via the ISA connector 134. The ISA control, address, and data signals are provided to transceivers 404 and 406. The transceivers 404 and 406 provide buffered control, address, and data signals to an FM synthesis device 408 and a CODEC 410. The FM synthesis device 408 provides its analog output as an input to the CODEC 410. The CODEC 410 is preferably a 16-bit stereo CODEC with an analog to digital converter, a digital to analog converter, an ISA bus interface to facilitate direct memory access (DMA) transfer, and an ISA interface for communicating with internal registers in the CODEC 510. Preferably, the CODEC 410 is the ESS688 manufactured by ESS of Fremont, Calif. The internal registers are used to control the operation of the CODEC 410 and one register includes a general purpose digital output. The CODEC 410 provides a POWER signal to an audio power control block 412, which provides the proper muting and power-on/off sequencing to the appropriate amplifiers in a headphone driver 416 and a PC speaker driver 418. The POWER signal is provided from the CODEC 410 internal register providing the general purpose digital output.

As further shown in FIG. 2, the CODEC 410 provides analog stereo outputs to a line out driver 414, the headphone driver 416, and the PC speaker driver 418. The audio board 400 also includes a volume control potentiometer 420 which provides volume level signals to the headphone driver 416 and the speaker driver 418. A speaker header 422 is provided to route the speaker output signal from the speaker driver 418 to the internal speaker of the computer system S. A headphone jack 424 provides for the electrical connection between a headphone, not shown, and the headphone driver 416. Similarly, a line out jack 426 provides electrical access to the output of the line out driver 414. A line-in jack 428 and a microphone jack 430 are provided on the audio board 400 to couple the appropriate devices to the analog inputs on the CODEC 410.

Turning now to FIG. 3, the audio power control block 412 is discussed in greater detail. In FIG. 3, the POWER output from the CODEC 410 is provided to a pair of delay generators 437 and 439. In delay generator 437, the POWER signal is provided to an inverter 440 whose output is connected in parallel to a resistor 442 and the cathode end of a diode 444. The other end of the resistor 442 and the anode end of the diode 444 are connected to one end of capacitors 446 and 448, whose other ends are connected to ground, and further connected to the input of an inverter 450. The output of the inverter 450 is connected to the input of an inverter 452 to generate an auto power down control (APDC) signal at the output of the inverter 452.

Similarly, in the second delay generator 439, the POWER signal is connected to an inverter 454 whose output is connected in parallel to a resistor 456 and the anode end of a diode 458. The other end of the resistor 456 and the cathode end of the diode 458 are connected to one of capacitors 460 and 462, whose other ends are connected to ground, and further connected to the input of an inverter 464. The output of the inverter 464 is connected to the input of an inverter 468 to generate the speaker mute (SPKMUTE) signal at the output of the inverter 468. The inverters 450 and 464 preferably have Schmitt triggered inputs to avoid oscillation, as the input signal has an analog transition rather than a standard digital transition.

When the computer system S has been idle for a period of time, the power-down sequence is performed. Details of determining the idle condition and the power-down sequence are not provided here for simplicity and because they are well known. An early example is provided in U.S. Pat. No. 4,980,836. During this power-down sequence, the POWER signal from the CODEC 410 is negated by driving the signal low. The inverters 440 and 454 negate the logic low input into a logic high level at the outputs. The forward biasing of the diode 458 allows the high signal to effectively bypass the resistor 456 to allow the capacitors 460 and 462 to be rapidly charged by the inverter 454. Thus, the SPKMUTE signal goes high a very short delay after the POWER signal is driven low. In contrast, the inverted POWER signal from the inverter 440 is forced to go through the resistor 442, as the diode 444 is reverse biased, which in combination with capacitors 446 and 448, provides a longer delay. The APDC signal then is asserted after the longer delay, much longer than the delay in the SPKMUTE signal. Therefore, the SPKMUTE signal is active a brief period before the APDC signal becomes active when the computer powers down. This allows the audio output to be muted before the amplifiers are turned off, so that the pops and snaps caused by the power-down are eliminated.

When the computer system S wakes up from its power down condition, the POWER signal from the CODEC 410 is asserted by driving it high. The inverters 440 and 454 negate the high input into a logic low level at the outputs. The forward biasing of the diode 444 allows the signal to effectively bypass the resistor 442 so that the APDC signal is negated relatively quickly. In contrast, the SPKMUTE signal experiences a greater delay as the low output of the inverter 454 reverse biases the diode 458 so that the resistor 456 and capacitors 460, 462 form the discharging circuit. Therefore, the APDC signal is negated a brief period before the SPKMUTE signal is negated. Thus, because the SPKMUTE signal is deasserted after power has been applied, the pops and snaps caused by the power-up are eliminated.

Referring to FIG. 4, the remaining power and driver circuits as used in conjunction with the outputs of the audio power control block 412, are shown in detail.

Turning to the top left of FIG. 4, the analog power regulation circuitry for the audio system is disclosed. In FIG. 4, a 12 V DC input is provided to a regulator 480 which provides 5 V DC at the output VDDESS. The output of the regulator 480 is decoupled using capacitors 482 and 484 before being provided to an analog power switching device 486, preferably an n-channel enhancement MOSFET. The 12 V DC is also coupled to the gate or control input of the switching device 486 via a resistor 488.

The analog power switching device 486 is turned on or off by the APDC signal from the inverter 452. One end of a resistor 490 receives the APDC signal, while the other end of the resistor 490 is connected to the base of an NPN transistor 492. The emitter of the transistor 492 is connected to ground, while the collector of the transistor 492 is connected to the other end of the resistor 488 and to the gate input of the analog power switching device 486. The output of the power switching device 486 is coupled to a plurality of decoupling capacitors 496, 498, and 500, as well as the power supply rail of a plurality of audio amplifiers 520, 530, and 554. Thus, the transistor 492 is turned on or off by the APDC signal to selectively turn on and off the power switching device 486 to deliver or cut-off power to the amplifiers 520, 530, and 554.

Turning to the lower left corner of FIG. 4, the SPKMUTE signal from the inverter 468 is provided to the base of an NPN transistor 504, whose emitter is grounded. The collector of the transistor 504 is connected to a pull-up resistor 508, a decoupling capacitor 506, and the volume control input of the amplifiers 520 and 530. The collector of the transistor 504 is also connected to one end of a potentiometer 510 for adjusting the headphone volume, while the other end of the potentiometer 510 is grounded. Thus, when the SPKMUTE signal is asserted, the volume inputs of the amplifiers 520 and 530 are clamped to a low level, muting the amplifiers 520 and 530.

Turning to the lower right section of FIG. 4, the left audio (L_AUDIO) signal is provided to the input of the amplifier 520 which generates the left headphone output (LHPOUT), while the right audio (R_AUDIO) signal is provided to the input of the amplifier 530 which generates the right headphone output (RHPOUT). The output of the amplifier 520 is connected to one end of resistor 522, while the other end of the resistor 522 is connected to a decoupling capacitor 524 and an AC-coupling capacitor 526. The second end of the capacitor 526 is connected to the left headphone input or headphone jack 424. Similarly, the output of amplifier 530 is connected to one end of a resistor 532, while the other end of the resistor 532 is connected to a decoupling capacitor 534 and an AC-coupling capacitor 536, which in turn is connected to the right headphone input of the headphone jack 424.

Referring to the upper right corner of FIG. 4, an amplifier 554 for the internal speaker 556 is shown in detail. The SPKMUTE signal from the inverter 468 is coupled to the base terminal of an NPN transistor 552, whose emitter is grounded. The collector terminal of the transistor 552 is connected to the volume control input of the amplifier 554 so that the amplifier 554 can be muted upon the assertion of the SPKMUTE signal. The volume control output of the amplifier 554 is further connected to the combination of a potentiometer 512, a capacitor 514, and a resistor 516 for adjusting the loudness of the speaker 550 when the amplifier 554 is not being muted.

In the preferred embodiment, the right audio signal is connected in parallel to a resistor 546 and a capacitor 548. Further, the right audio signal is AC-coupled through a capacitor 550 to the input of the amplifier 554. The output of the amplifier 554 is then delivered to the speaker 556 for communicating audio information to the user. Although the preferred embodiment discloses a monaural speaker system, a stereo speaker system can be implemented using a second amplifier to handle the left audio signal in conjunction with the amplifier 554 which handles the right audio signal.

In operation, the APDC signal controls the delivery of power via the power switching device 486, while the SPKMUTE signal controls the volume input to the amplifiers 520, 530, and 554. It can be seen that when the computer system S powers-up from a power conservation power-down state, the SPKMUTE signal is active a brief period longer than the APDC signal is active so that the amplifier is muted while the amplifier is turning on. It can also be seen that when the computer system S powers-down during a power conservation operation, the SPKMUTE signal is active before the APDC signal becomes active so that muting occurs before the removal of power from the audio amplifier. Thus, the pops and snaps caused by the power up or power down of computer system S are eliminated, with this control being performed using only a single digital control pin.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A computer system having a sound system which controls noise signals resulting from transients generated by the power-up or power-down of portions of said computer system, said computer system having a status signal indicative of the power state of the portions of the computer system, said computer system comprising:

a processor;

a data storage device coupled to said processor;

a power indicator having a resistor connected in parallel with a diode, said power indicator having a capacitor connected to the anode end of said diode and to ground, said power indicator receiving said status signal at the cathode end of said diode;

a mute indicator having a resistor connected in parallel with a diode, said mute indicator having a capacitor connected to the cathode end of said diode and to ground, said mute indicator receiving said status signal at the anode end of said diode; and a sound generator coupled to said processor and said data storage device, said processor fetching sound data from said data storage device and delivering said sound data to said sound generator, said sound generator including:

an amplifier with a volume control input and a power supply input, said volume control input coupled to the cathode end of said diode in said mute indicator; and a power switch having a control input coupled to the anode end of said diode of said power indicator and an output coupled to said power supply input of said amplifier.

2. The computer system of claim 1, wherein said power indicator further includes a buffer receiving said status signal and providing a buffered status signal to said cathode end of said diode, and wherein said mute indicator further includes a buffer receiving said status signal and providing a buffered status signal to said anode end of said diode.

3. The computer system of claim 1, further comprising a Schmitt-triggered circuit coupling the output of said power indicator to said power switch control input.

4. The computer system of claim 3, wherein said Schmitt-triggered circuit is an inverter.

5. The computer system of claim 1, further comprising a Schmitt-triggered circuit coupling the output of said mute indicator to said amplifier volume control input.

6. The computer system of claim 5, wherein said Schmitt-triggered circuit is an inverter.

7. The computer system of claim 1, further comprising a transistor coupling the output of said mute indicator to said amplifier volume control input.

8. The computer system of claim 1, further comprising a transistor coupling the output of said power indicator to said power switch control input.

9. The computer system of claim 8, wherein said transistor is a field effect transistor.

10. The computer system of claim 1, further comprising a left headphone amplifier and a right headphone amplifier, each of said headphone amplifiers having a volume control input coupled to the output of said mute indicator.

11. The computer system of claim 10, further comprising a transistor coupling the output of said mute indicator to said left and right amplifier volume control inputs.

* * * * *